US012812786B2

United States Patent

(12) United States Patent
Otsubo et al.
(10) Patent No.: US 12,812,786 B2
(45) Date of Patent: Nov. 24, 2026

(54) CIRCUIT MODULE

(71) Applicant: Murata Manufacturing Co., Ltd., Nagaokakyo (JP)

(72) Inventors: Yoshihito Otsubo, Nagaokakyo (JP); Tsuyoshi Takakura, Nagaokakyo (JP); Hiroki Yoshimori, Nagaokakyo (JP); Hideo Nakagoshi, Nagaokakyo (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 265 days.

(21) Appl. No.: 18/790,339

(22) Filed: Jul. 31, 2024

(65) Prior Publication Data

US 2024/0389234 A1 Nov. 21, 2024

Related U.S. Application Data

(63) Continuation of application No. PCT/JP2023/004326, filed on Feb. 9, 2023.

(30) Foreign Application Priority Data

Feb. 16, 2022 (JP) ................................ 2022-021967

(51) Int. Cl.
*H05K 1/14* (2006.01)

(52) U.S. Cl.
CPC ..... *H05K 1/144* (2013.01); *H05K 2201/0364* (2013.01); *H05K 2201/09227* (2013.01)

(58) Field of Classification Search
CPC ........... H05K 1/144; H05K 2201/0364; H05K 2201/09227
USPC .......................................................... 361/784
See application file for complete search history.

(56) References Cited

U.S. PATENT DOCUMENTS 6,781,241 B2 * 8/2004 Nishimura ............ H10W 90/00 257/723
8,106,495 B2 * 1/2012 Kajiki ................. H10W 74/016 257/E23.18
11,239,821 B2 2/2022 Nomiya
12,177,990 B2 12/2024 Kitazume
2004/0195591 A1 10/2004 Gehman
2005/0035440 A1 * 2/2005 Mohammed ........ H10W 70/688 257/E25.023

(Continued)

FOREIGN PATENT DOCUMENTS

JP 2007-173570 A 7/2007
JP 2009-124151 A 6/2009

(Continued)

OTHER PUBLICATIONS

International Search Report for PCT/JP2023/004326 dated Apr. 25, 2023.

*Primary Examiner* — Binh B Tran
(74) *Attorney, Agent, or Firm* — McDonald Hopkins LLC

(57) ABSTRACT

In a circuit module of the present disclosure, one or more solder balls have an ellipsoidal shape, are located in an inter-board region between an upper circuit board and a lower circuit board, and electrically connect the upper circuit board and the lower circuit board. The size of the second solder ball is larger than the size of the first solder ball. A first sealing resin is provided in the inter-board region so as to be in contact with a first lower main surface and a second upper main surface and to cover surfaces of the one or more second solder balls.

20 Claims, 6 Drawing Sheets

(56) References Cited

U.S. PATENT DOCUMENTS

| | | | | |
|---|---|---|---|---|
| 2006/0012037 | A1 | 1/2006 | Raedt et al. | |
| 2009/0261466 | A1 * | 10/2009 | Pagaila | H10P 72/74 257/737 |
| 2010/0133704 | A1 * | 6/2010 | Marimuthu | H10P 72/74 257/E23.116 |
| 2017/0117214 | A1 * | 4/2017 | Park | H10W 20/20 |
| 2019/0181068 | A1 | 6/2019 | Funakawa | |
| 2020/0058599 | A1 | 2/2020 | Okada | |

FOREIGN PATENT DOCUMENTS

| | | | |
|---|---|---|---|
| JP | 4704800 | B2 | 6/2011 |
| JP | 2016-063002 | A | 4/2016 |
| JP | 2018-535541 | A | 11/2018 |
| JP | 2020-161508 | A | 10/2020 |
| KR | 20150124251 | A | 11/2015 |
| WO | 2019/045088 | A1 | 3/2019 |
| WO | 2021/176871 | A1 | 9/2021 |

* cited by examiner

CIRCUIT MODULE

CROSS REFERENCE TO RELATED APPLICATION

This is a continuation of International Application No. PCT/JP2023/004326 filed on Feb. 9, 2023 which claims priority from Japanese Patent Application No. 2022-021967 filed on Feb. 16, 2022. The contents of these applications are incorporated herein by reference in their entireties.

BACKGROUND OF THE DISCLOSURE

Field of the Disclosure

The present disclosure relates to a circuit module including an upper circuit board and a lower circuit board.

Description of the Related Art

As a disclosure related to a conventional circuit module, for example, a module described in Patent Literature 1 is known. This module has a structure in which two mounting boards arranged vertically are connected by columnar pins.

Patent Literature 1

Japanese Patent Unexamined Publication No. 2020-161508 bulletin

BRIEF SUMMARY OF THE DISCLOSURE

Incidentally, reflow of solder is performed when the module described in Patent Literature 1 is mounted on a board such as a motherboard. Due to the heat during this reflow, the mounting board may be warped.

Therefore, a possible benefit of the present disclosure is to provide a circuit module capable of suppressing occurrence of warpage in a circuit board.

The inventor of the present application has studied a method for suppressing warpage of the mounting board in the module described in Patent Literature 1. As a result of this study, the inventor of the present application has considered that it is sufficient to strengthen the connection between the two mounting boards by thickening the columnar pins. As a result, the inventor of the present application has considered that occurrence of warpage in the mounting board can be suppressed. Therefore, the inventor of the present application has considered employing a solder ball that is easier to change in size such as thickness than a columnar pin.

However, for the following reasons, a person skilled in the art does not change the columnar pins to solder balls. The region where the columnar pins are disposed is located between the two mounting boards, and the electronic components are disposed. Therefore, it is difficult to resin-seal this region. However, in the module described in Patent Literature 1, since the columnar pins are disposed, the columnar pins hardly interfere with the flow of the sealing resin. On the other hand, the diameter of the solder ball varies depending on the position in the up-down direction. Specifically, the diameter of the solder ball at the center in the up-down direction is different from the diameters of the solder balls at the upper end and the lower end. Since such a solder ball has a complicated shape, the solder ball easily obstructs the flow of the sealing resin. Therefore, if the injection pressure of the resin sealing is not increased, the adhesion between the sealing resin and the solder ball is likely to decrease. Therefore, a person skilled in the art usually does not change the columnar pins to solder balls.

Therefore, the inventor of the present application made earnest efforts, and found that the solder ball may be enlarged. More specifically, the inventor of the present application has noticed that, as a problem of resin sealing, there is a problem of adhesion between the sealing resin and a connection member (the columnar pin and the solder ball) similarly to a problem of fluidity of the sealing resin. The inventor of the present application has considered that the problem of fluidity of the sealing resin can be compensated by improving the adhesion between the sealing resin and the connection member. Specifically, when the solder ball becomes large, the solder ball easily obstructs the flow of the sealing resin, which is not preferable. However, when the solder ball is increased in size, the contact area between the sealing resin and the solder ball is dramatically increased, so that adhesion between the sealing resin and the solder ball is dramatically improved. Therefore, the inventor of the present application has found that the problem of fluidity of the sealing resin can be compensated by the adhesion of the resin by enlarging the solder ball.

A circuit module according to an embodiment of the present disclosure includes: an upper circuit board having a first upper main surface and a first lower main surface arranged in an up-down direction; a lower circuit board having a second upper main surface and a second lower main surface arranged in the up-down direction, the lower circuit board being located below the upper circuit board and overlapping the upper circuit board when viewed in the up-down direction; one or more first solder balls having an ellipsoidal shape and provided on the second lower main surface; one or more second solder balls having an ellipsoidal shape, located in an inter-board region between the upper circuit board and the lower circuit board, and electrically connecting the upper circuit board and the lower circuit board, the one or more second solder balls having a size larger than a size of the one or more first solder balls; and a first sealing resin provided in the inter-board region so as to be in contact with the first lower main surface and the second upper main surface and cover surfaces of the one or more second solder balls.

Hereinafter, the positional relationship of members in the present specification will be defined. A first member to a third member are components of the circuit module. In the present specification, the first member and the second member arranged in the front-back direction indicate the following state. Both the first member and the second member are in the state of being disposed on an arbitrary straight line indicating the front-back direction when the first member and the second member are viewed in a direction perpendicular to the front-back direction. In the present specification, the first member and the second member arranged in the front-back direction when viewed in the up-down direction indicate the following state. Both the first member and the second member are disposed on an arbitrary straight line indicating the front-back direction when the first member and the second member are viewed in the up-down direction. In this case, any one of the first member and the second member is not necessarily disposed on an arbitrary straight line indicating the front-back direction when the first member and the second member are viewed from the left-right direction different from the up-down direction. Note that the first member and the second member may be in contact with each other. The first member and the second member may be separated from each other. The third member may be present between the first member and the second member. This definition also applies to directions other than the front-back direction.

In the present specification, the first member being disposed above the second member indicates the following state. At least a part of the first member is located directly above the second member. Therefore, when viewed in the up-down direction, the first member overlaps the second member. This definition also applies to directions other than the up-down direction.

In the present specification, the first member being disposed higher than the second member includes a case where at least a part of the first member is located directly above the second member and a case where the first member is located diagonally above the second member without being located directly above the second member. In this case, the first member may not overlap the second member when viewed in the up-down direction. The term "diagonally above" means, for example, upper left and upper right. This definition also applies to directions other than the up-down direction.

In the present specification, each portion of the first member is defined as follows unless otherwise specified. A front portion of the first member means the front half of the first member. A back portion of the first member means the back half of the first member. A left portion of the first member means the left half of the first member. A right portion of the first member means the right half of the first member. An upper portion of the first member means the upper half of the first member. A lower portion of the first member means the lower half of the first member. A front end of the first member means an end of the first member in the forward direction. A back end of the first member means an end of the first member in the backward direction. A left end of the first member means an end of the first member in the leftward direction. A right end of the first member means an end of the first member in the rightward direction. An upper end of the first member means an end of the first member in the upward direction. A lower end of the first member means an end of the first member in the downward direction. A front end portion of the first member means a front end of the first member and the vicinity thereof. A back end portion of the first member means a back end of the first member and the vicinity thereof. A left end portion of the first member means a left end of the first member and the vicinity thereof. A right end portion of the first member means a right end of the first member and the vicinity thereof. An upper end portion of the first member means an upper end of the first member and the vicinity thereof. A lower end portion of the first member means a lower end of the first member and the vicinity thereof.

When any two members in the present specification are defined as the first member and the second member, a relationship between any two members has the following meaning. In the present specification, the first member being supported by the second member includes a case where the first member is attached to the second member so as to be immovable with respect to the second member (that is, it is fixed) and a case where the first member is attached to the second member so as to be movable with respect to the second member. The first member being supported by the second member further includes both of a case where the first member is directly attached to the second member and a case where the first member is attached to the second member with the third member interposed therebetween.

In the present specification, the first member being held by the second member includes a case where the first member is attached to the second member so as to be immovable with respect to the second member (that is, it is fixed), and does not include a case where the first member is attached to the second member so as to be movable with respect to the second member. The first member being held by the second member further includes both of a case where the first member is directly attached to the second member and a case where the first member is attached to the second member with the third member interposed therebetween.

In the present specification, "the first member and the second member are electrically connected" means that electricity is conducted between the first member and the second member. Therefore, the first member and the second member may be in contact with each other, or the first member and the second member may not be in contact with each other. When the first member and the second member are not in contact with each other, the third member having conductivity is disposed between the first member and the second member.

According to the circuit module of the present disclosure, occurrence of warpage in the circuit board can be suppressed.

DETAILED DESCRIPTION OF THE DISCLOSURE

Embodiments

Structure of Circuit Module

Figure 1:
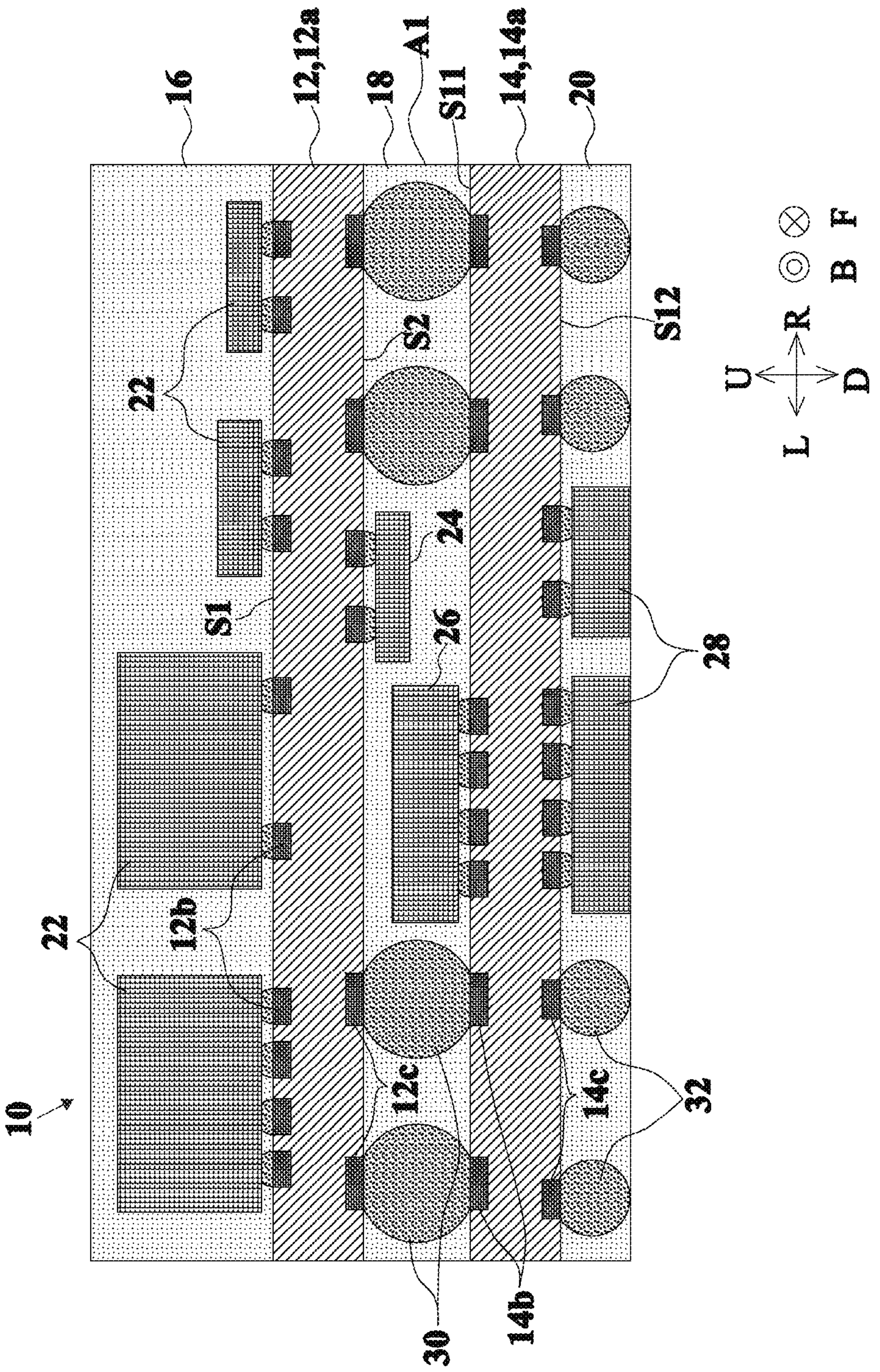
FIG. 1 is a cross-sectional view of a circuit module 10.

Hereinafter, a structure of a circuit module 10 according to an embodiment of the present disclosure will be described. FIG. 1 is a cross-sectional view of the circuit module 10.

Hereinafter, as illustrated in FIG. 1, a direction in which a first upper main surface S1 and a first lower main surface S2 of an upper circuit board 12 of the circuit module 10 are arranged is defined as an up-down direction. In addition, directions orthogonal to the up-down direction are defined as a front-back direction and a left-right direction. The front-back direction and the left-right direction are orthogonal to each other. The front-back direction coincides with the direction perpendicular to the paper surface of FIG. 1. The left-right direction coincides with the left-right direction of the paper surface of FIG. 1. However, the up-down direction, the left-right direction, and the front-back direction in the present specification are directions defined for convenience of description, and may not coincide with the up-down direction, the left-right direction, and the front-back direction when the circuit module 10 is used. In each drawing, the upward direction and the downward direction may be interchanged, the leftward direction and the rightward direction may be interchanged, or the forward direction and the backward direction may be interchanged.

The circuit module 10 is used for a wireless communication terminal such as a smartphone. The circuit module 10 includes, for example, a semiconductor integrated circuit (power amplifier of transmission system and low noise amplifier of reception system), a coil and/or a capacitor as a matching circuit, and the like. The circuit module 10 has a rectangular parallelepiped shape. As illustrated in FIG. 1, the circuit module 10 includes an upper circuit board 12, a lower circuit board 14, a second sealing resin 16, a first sealing resin 18, a third sealing resin 20, a plurality of third electronic components 22, a plurality of first electronic components 24, a plurality of second electronic components 26, a plurality of fourth electronic components 28, a plurality of second solder balls 30, and a plurality of first solder balls 32.

The upper circuit board 12 has a first upper main surface S1 and a first lower main surface S2 arranged in the up-down direction. More specifically, the upper circuit board 12 includes a board body 12*a*, a plurality of mounting electrodes 12*b*, and a plurality of mounting electrodes 12*c*. The board body 12*a* has a plate shape having the first upper main surface S1 and the first lower main surface S2. The board body 12*a* has a rectangular shape having two sides extending in the front-back direction and two sides extending in the left-right direction when viewed in the up-down direction. The board body 12*a* has a multilayer structure. An electric circuit (not illustrated) is provided inside the board body 12*a*. The board body 12*a* is, for example, a glass-epoxy board or an LTCC-based board.

The plurality of mounting electrodes 12*b* are provided on the first upper main surface S1. The plurality of mounting electrodes 12*c* are provided on the first lower main surface S2. The plurality of mounting electrodes 12*b* and the plurality of mounting electrodes 12*c* have a rectangular shape or a circular shape when viewed in the up-down direction. The plurality of mounting electrodes 12*b* and the plurality of mounting electrodes 12*c* have, for example, a structure in which Ni plating and Au plating are applied to the surface of the copper electrode.

The lower circuit board 14 has a second upper main surface S11 and a second lower main surface S12 arranged in the up-down direction. More specifically, the lower circuit board 14 includes a board body 14*a*, a plurality of mounting electrodes 14*b*, and a plurality of mounting electrodes 14*c*. The board body 14*a* has a plate shape having the second upper main surface S11 and the second lower main surface S12. The board body 14*a* has a rectangular shape having two sides extending in the front-back direction and two sides extending in the left-right direction when viewed in the up-down direction. The board body 14*a* has a multilayer structure. An electric circuit (not illustrated) is provided inside the board body 14*a*. The material of the board body 14*a* is, for example, glass epoxy.

The plurality of mounting electrodes 14*b* are provided on the second upper main surface S11. The plurality of mounting electrodes 14*c* are provided on the second lower main surface S12. The plurality of mounting electrodes 14*b* and the plurality of mounting electrodes 14*c* have a rectangular shape or a circular shape when viewed in the up-down direction. The plurality of mounting electrodes 14*b* and the plurality of mounting electrodes 14*c* have a structure in which, for example, Ni plating and Au plating are applied to the surface of a copper thin film.

The lower circuit board 14 as described above is located below the upper circuit board 12. The lower circuit board 14 overlaps the upper circuit board 12 when viewed in the up-down direction. When viewed in the up-down direction, the entire outer edge of the lower circuit board 14 overlaps the entire outer edge of the upper circuit board 12.

The plurality of first solder balls 32 have an ellipsoidal shape. In the present specification, a sphere is a concept included in an ellipsoid. In the present embodiment, the plurality of first solder balls 32 have a spherical shape. The plurality of first solder balls 32 are provided on the second lower main surface S12. More precisely, the plurality of first solder balls 32 are provided on the plurality of mounting electrodes 14*c*. The plurality of first solder balls 32 come into contact with a mounting electrode of a motherboard when the circuit module 10 is mounted on the motherboard. That is, the plurality of first solder balls 32 are solder bumps.

The plurality of second solder balls 30 have an ellipsoidal shape. In the present embodiment, the plurality of second solder balls 30 have a spherical shape. The plurality of second solder balls 30 are located in the inter-board region A1 between the upper circuit board 12 and the lower circuit board 14. The plurality of second solder balls 30 electrically connect the upper circuit board 12 and the lower circuit board 14. Specifically, the plurality of second solder balls 30 are provided on the first lower main surface S2 and the second upper main surface S11. More precisely, the plurality of second solder balls 30 are in contact with the plurality of mounting electrodes 12*c* of the upper circuit board 12 and the plurality of mounting electrodes 14*b* of the lower circuit board 14.

The size of the second solder ball 30 is larger than the size of the first solder ball 32. In the present embodiment, the plurality of second solder balls 30 and the plurality of first solder balls 32 are provided. Accordingly, the size of the second solder ball 30 is an average value of the plurality of second solder balls 30. The size of the first solder ball 32 is an average value of the plurality of first solder balls 32. In the present embodiment, the second solder balls 30 and the first solder balls 32 have spherical shapes. Accordingly, the size of the second solder ball 30 is the diameter of the second solder ball 30. The size of the first solder ball 32 is a diameter of the first solder ball 32.

The plurality of third electronic components 22 are mounted on the first upper main surface S1. That is, the plurality of third electronic components 22 are mounted on the plurality of mounting electrodes 12*b*. The plurality of first electronic components 24 are mounted on the first lower main surface S2. That is, the plurality of first electronic components 24 are mounted on the plurality of mounting electrodes 12*c*. The plurality of second electronic components 26 are mounted on the second upper main surface S11. That is, the plurality of second electronic components 26 are mounted on the plurality of mounting electrodes 14*b*. The plurality of second electronic components 26 do not overlap the plurality of first electronic components 24 when viewed in the up-down direction. The plurality of fourth electronic components 28 are mounted on the second lower main surface S12. That is, the plurality of fourth electronic components 28 are mounted on the plurality of mounting electrodes 14*c*. The plurality of third electronic components 22, the plurality of first electronic components 24, the plurality of second electronic components 26, and the plurality of fourth electronic components 28 as described above are electronic components such as chip coils, chip capacitors, and semiconductor integrated circuits.

The first sealing resin 18 is provided in the inter-board region A1 so as to be in contact with the first lower main surface S2 and the second upper main surface S11 and to cover the surfaces of the plurality of second solder balls 30. The first sealing resin 18 covers the surfaces of the plurality of first electronic components 24 and the plurality of second electronic components 26. Therefore, the plurality of second solder balls 30, the plurality of first electronic components 24, and the plurality of second electronic components 26 are located in the first sealing resin 18.

Here, as described above, the inter-board region A1 is a region located between the upper circuit board 12 and the lower circuit board 14. The upper circuit board 12 and the lower circuit board 14 have rectangular shapes when viewed in the up-down direction. Therefore, the inter-board region A1 has a rectangular parallelepiped shape. Thus, the first sealing resin 18 has a rectangular parallelepiped shape. When viewed in the up-down direction, the entire outer edge of the first sealing resin 18 overlaps the entire outer edge of the upper circuit board 12 and the entire outer edge of the lower circuit board 14. Such a first sealing resin 18 fills the inter-board region A1 without any gap. However, slight air bubbles may remain in the first sealing resin 18.

The second sealing resin 16 covers the first upper main surface S1. The second sealing resin 16 covers the surfaces of the plurality of third electronic components 22. Therefore, the plurality of third electronic components 22 are disposed in the second sealing resin 16. The second sealing resin 16 has a rectangular parallelepiped shape. When viewed in the up-down direction, the entire outer edge of the second sealing resin 16 overlaps the entire outer edge of the upper circuit board 12 and the entire outer edge of the lower circuit board 14.

The third sealing resin 20 covers the second lower main surface S12. The third sealing resin 20 covers the surfaces of the plurality of first solder balls 32 and the side surfaces of the plurality of fourth electronic components 28. However, the lower end portions of the plurality of first solder balls 32 and the lower surfaces of the plurality of fourth electronic components 28 are exposed from the third sealing resin 20. Therefore, the plurality of first solder balls 32 and the plurality of fourth electronic components 28 are located in the third sealing resin 20. The third sealing resin 20 has a rectangular parallelepiped shape. When viewed in the up-down direction, the entire outer edge of the third sealing resin 20 overlaps the entire outer edge of the upper circuit board 12 and the entire outer edge of the lower circuit board 14. The material of the second sealing resin 16, the material of the first sealing resin 18, and the material of the third sealing resin 20 as described above are, for example, epoxy resins.

Effects

According to the circuit module 10, it is possible to suppress occurrence of warpage in the upper circuit board 12 and the lower circuit board 14. More specifically, the size of the second solder ball 30 is larger than the size of the first solder ball 32. As a result, the upper circuit board 12 and the lower circuit board 14 are coupled by the plurality of second solder balls 30 having high strength. As a result, even when heat is applied to the lower circuit board 14 at the time of mounting the circuit module 10 on the motherboard, occurrence of warpage in the lower circuit board 14 is prevented by the plurality of second solder balls 30 and the upper circuit board 12. Therefore, according to the circuit module 10, occurrence of warpage in the lower circuit board 14 can be suppressed.

According to the circuit module 10, the plurality of second electronic components 26 do not overlap the plurality of first electronic components 24 when viewed in the up-down direction. This prevents the first electronic component 24 and the second electronic component 26 from being arranged in the up-down direction. Therefore, the height of the circuit module 10 in the up-down direction decreases.

First Modification

Figure 2:
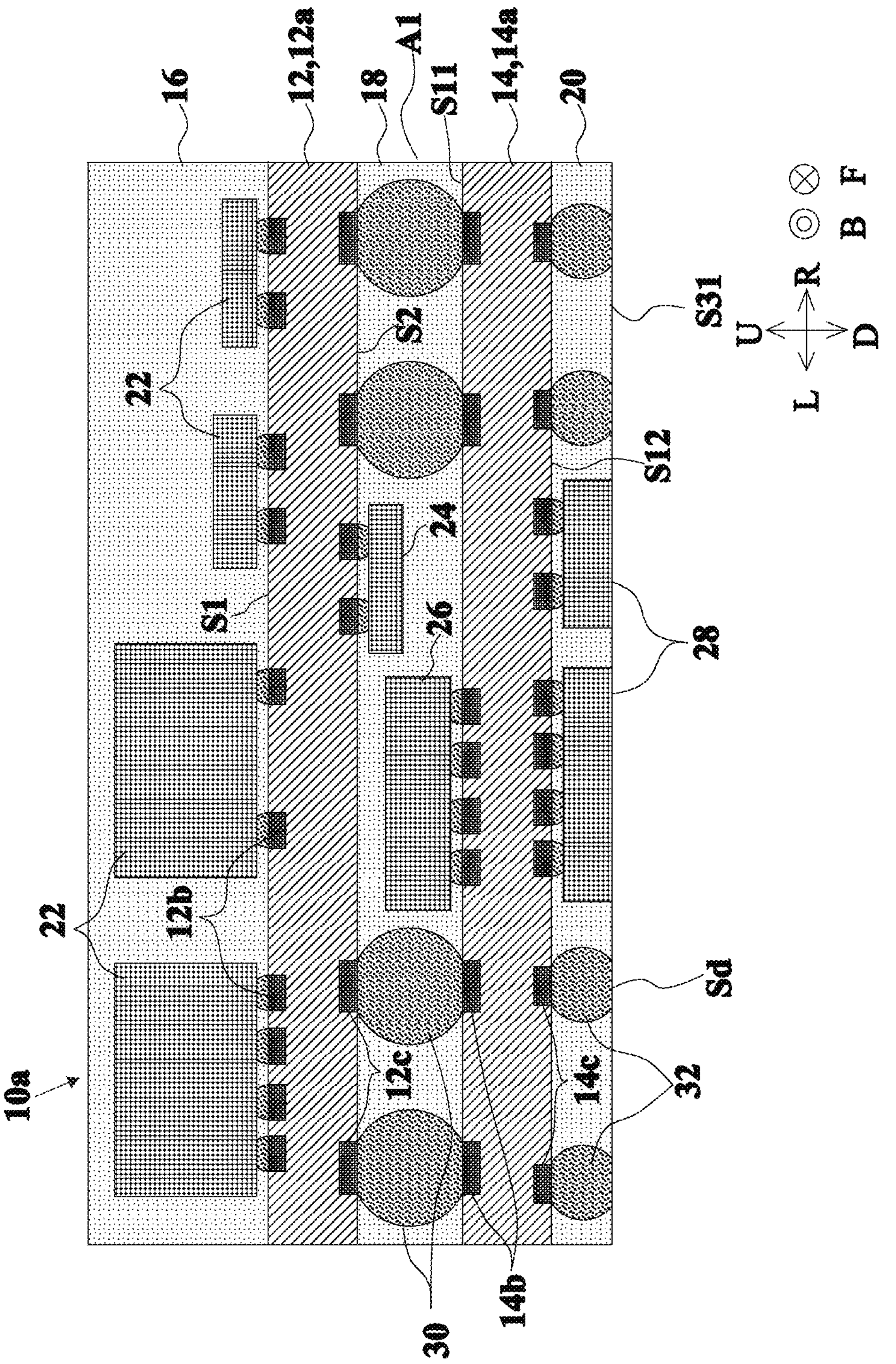
FIG. 2 is a cross-sectional view of a circuit module **10*a***.

Hereinafter, a circuit module 10*a* according to a first modification will be described with reference to the drawings. FIG. 2 is a cross-sectional view of the circuit module 10*a*.

The circuit module 10*a* is different from the circuit module 10 in the shape of the plurality of first solder balls 32. More specifically, the plurality of first solder balls 32 each have a bottom surface Sd that is a plane orthogonal to the up-down direction. The bottom surfaces Sd of the plurality of first solder balls 32 are included in one plane together with the lower main surface S31 of the third sealing resin 20. That is, the bottom surfaces Sd of the plurality of first solder balls 32 are flush with the lower main surface S31 of the third sealing resin 20. Such a circuit module 10*a* is manufactured by polishing the lower main surface S31 of the third sealing resin 20. Other structures of the circuit module 10*a* are the same as those of the circuit module 10, and thus description will be omitted. The circuit module 10*a* can achieve the same effects as those of the circuit module 10.

According to the circuit module 10*a*, since the lower main surface S31 of the third sealing resin 20 is polished, the height of the third sealing resin 20 can be reduced. In addition, the bottom surfaces Sd of the plurality of first solder balls 32 are exposed from the lower main surface S31 of the third sealing resin 20. Therefore, the area of the plurality of first solder balls 32 exposed from the lower main surface S31 of the third sealing resin 20 in the circuit module 10*a* is larger than the area of the plurality of first solder balls 32 exposed from the lower main surface S31 of the third sealing resin 20 in the circuit module 10. Therefore, according to the circuit module 10*a*, the area of the first solder ball 32 exposed from the third sealing resin 20 increases when the circuit module 10*a* is mounted on the motherboard. As a result, the circuit module 10*a* is more reliably electrically connected to the motherboard.

Second Modification

Figure 3:
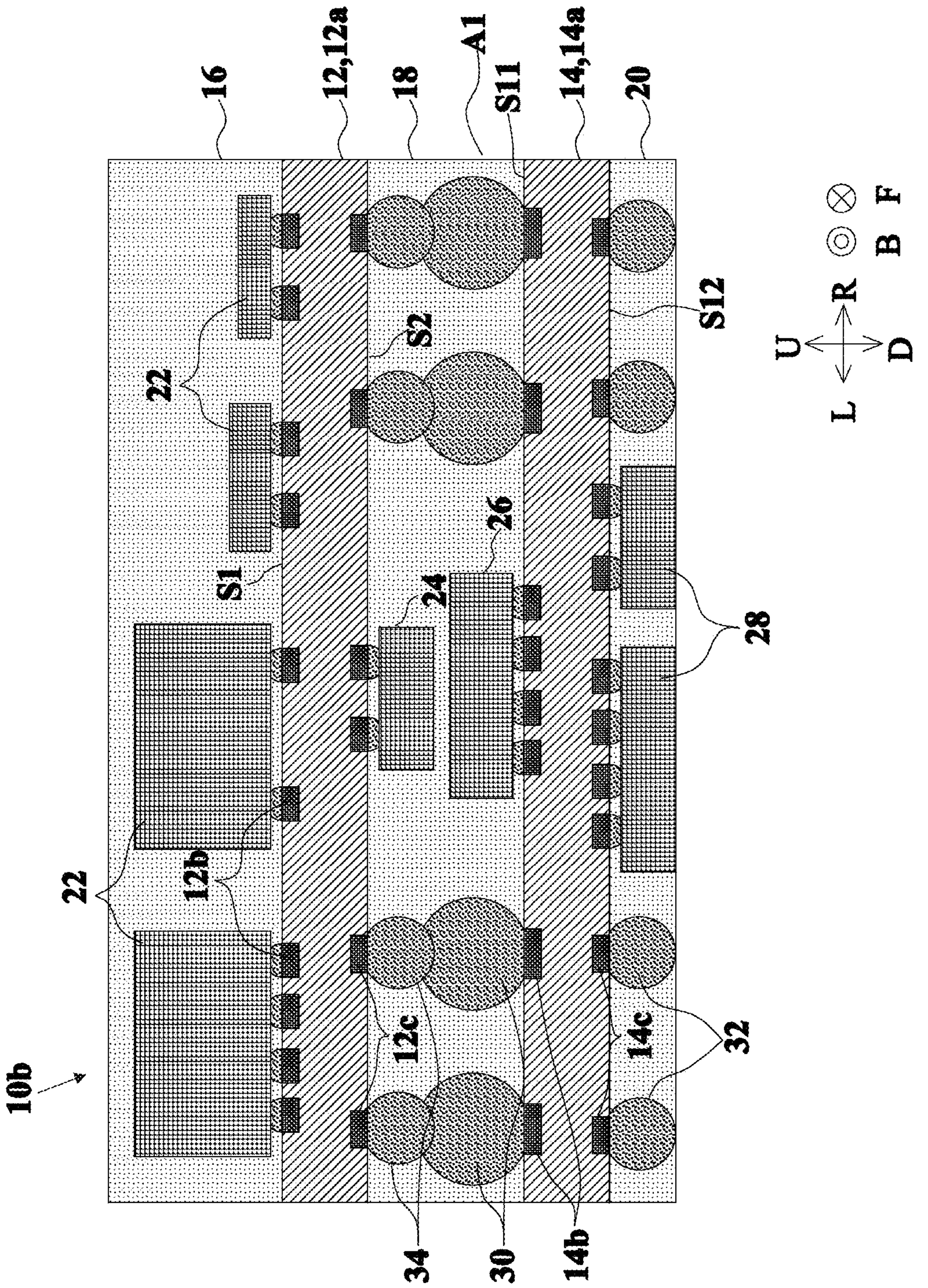
FIG. 3 is a cross-sectional view of a circuit module **10*b***.

Hereinafter, a circuit module 10*b* according to a second modification will be described with reference to the drawings. FIG. 3 is a cross-sectional view of the circuit module 10*b*.

The circuit module 10*b* is different from the circuit module 10 in further including a plurality of third solder balls 34. The third solder ball 34 has an ellipsoidal shape. In the present embodiment, the third solder ball 34 has a spherical shape. The plurality of third solder balls 34 are located in the inter-board region A1 between the upper circuit board 12 and the lower circuit board 14. The plurality of third solder balls 34 electrically connect the upper circuit board 12 and the lower circuit board 14. Specifically, the plurality of second solder balls 30 are in contact with the mounting electrode 14*b* of the lower circuit board 14. The plurality of third solder balls 34 are in contact with the mounting electrode 12*c* of the upper circuit board 12. The plurality of second solder balls 30 and the plurality of third solder balls 34 are arranged in the up-down direction and are in contact with each other. The sizes of the third solder balls 34 are smaller than the sizes of the second solder balls 30.

At least one of the plurality of first electronic components 24 overlaps at least one of the plurality of second electronic components 26 when viewed in the up-down direction. Other structures of the circuit module 10*b* are the same as those of the circuit module 10, and thus description will be omitted. The circuit module 10*b* has the same functions and effects as those of the circuit module 10.

In addition, according to the circuit module 10*b*, the area of the circuit module 10*b* when viewed in the up-down direction can be reduced. More specifically, the plurality of second solder balls 30 and the plurality of third solder balls 34 are arranged in the up-down direction. Therefore, the height of the inter-board region A1 in the up-down direction increases. Therefore, at least one of the plurality of first electronic components 24 overlaps at least one of the plurality of second electronic components 26 when viewed in the up-down direction. As a result, for example, in the circuit module 10*b* of FIG. 3, the mounting density of the electronic components in the inter-board region A1 can be increased. Furthermore, the length of the circuit module 10*b* in the left-right direction can be shortened. As described above, according to the circuit module 10*b*, the mounting density of the electronic components of the circuit module 10*b* can be increased, and the area of the circuit module 10*b* viewed in the up-down direction can be reduced.

Third Modification

Figure 4:
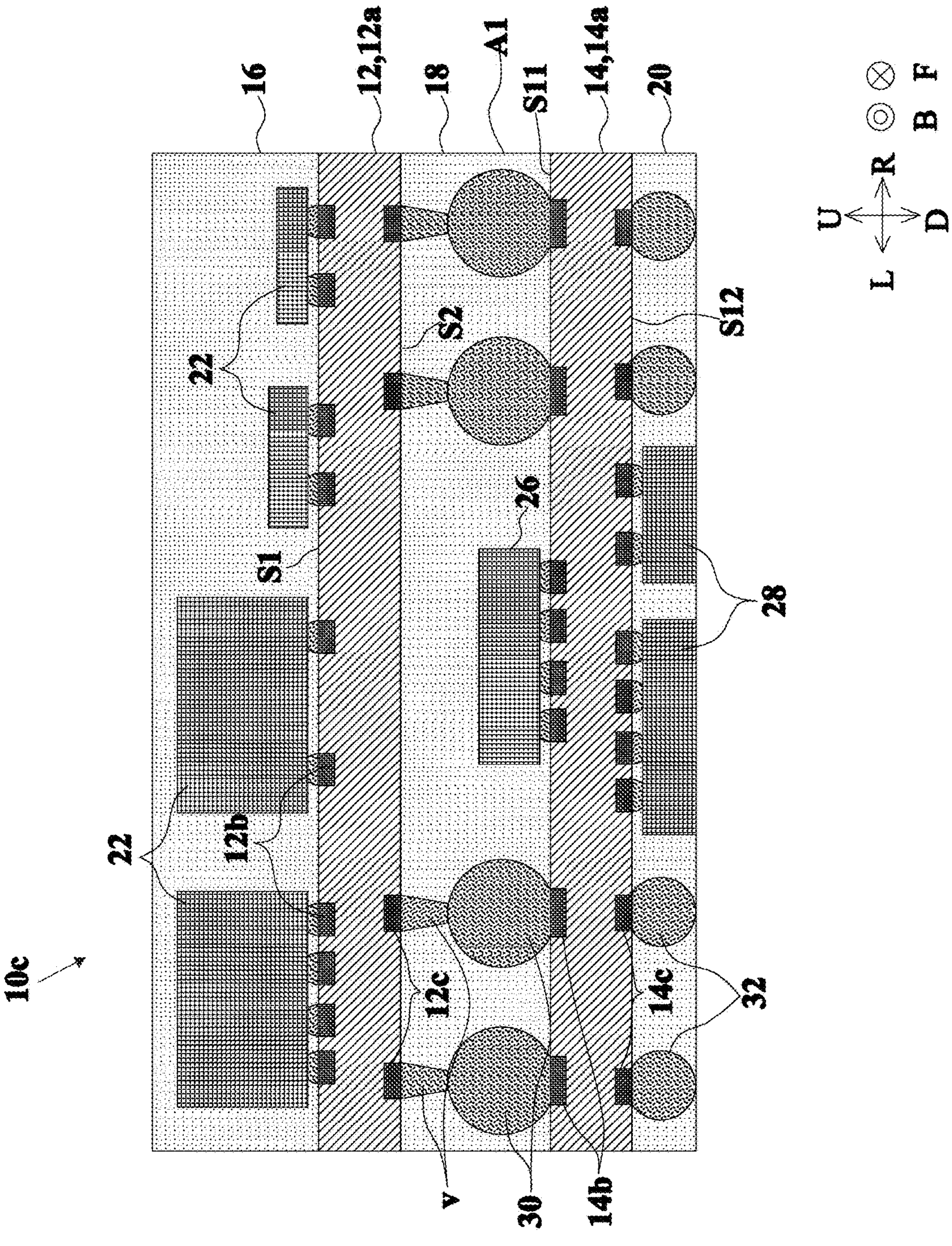
FIG. 4 is a cross-sectional view of a circuit module **10*c***.

Hereinafter, a circuit module 10*c* according to a third modification will be described with reference to the drawings. FIG. 4 is a cross-sectional view of the circuit module 10*c*.

The circuit module 10*c* is different from the circuit module 10 in including a plurality of via hole conductors v and not including the plurality of first electronic components 24. More specifically, the plurality of via hole conductors v have a frustum shape having a central axis extending in the up-down direction. The plurality of via hole conductors v are located in the inter-board region A1 between the upper circuit board 12 and the lower circuit board 14. The plurality of via hole conductors v electrically connect the upper circuit board 12 and the lower circuit board 14. The plurality of second solder balls 30 are in contact with the mounting electrode 14*b* of the lower circuit board 14. The plurality of via hole conductors v are in contact with the mounting electrode 12*c* of the upper circuit board 12. The plurality of second solder balls 30 and the plurality of via hole conductors v are arranged in the up-down direction and are in contact with each other. Other structures of the circuit module 10*c* are the same as those of the circuit module 10, and thus description will be omitted. The circuit module 10*c* has the same functions and effects as those of the circuit module 10.

The manufacturing process of the circuit module 10*c* is as follows. The first sealing resin 18 is formed on the second upper main surface S11 of the lower circuit board 14 on which the plurality of second solder balls 30 and the second electronic component 26 are mounted. Thereafter, a plurality of holes are formed by irradiation with a laser beam. Then, the plurality of holes are filled with a conductive paste which is a mixture of resin and metal. Then, the conductive paste is sintered to form the plurality of via hole conductors v. Thereafter, the upper circuit board 12 is mounted on the first sealing resin 18.

Fourth Modification

Figure 5:
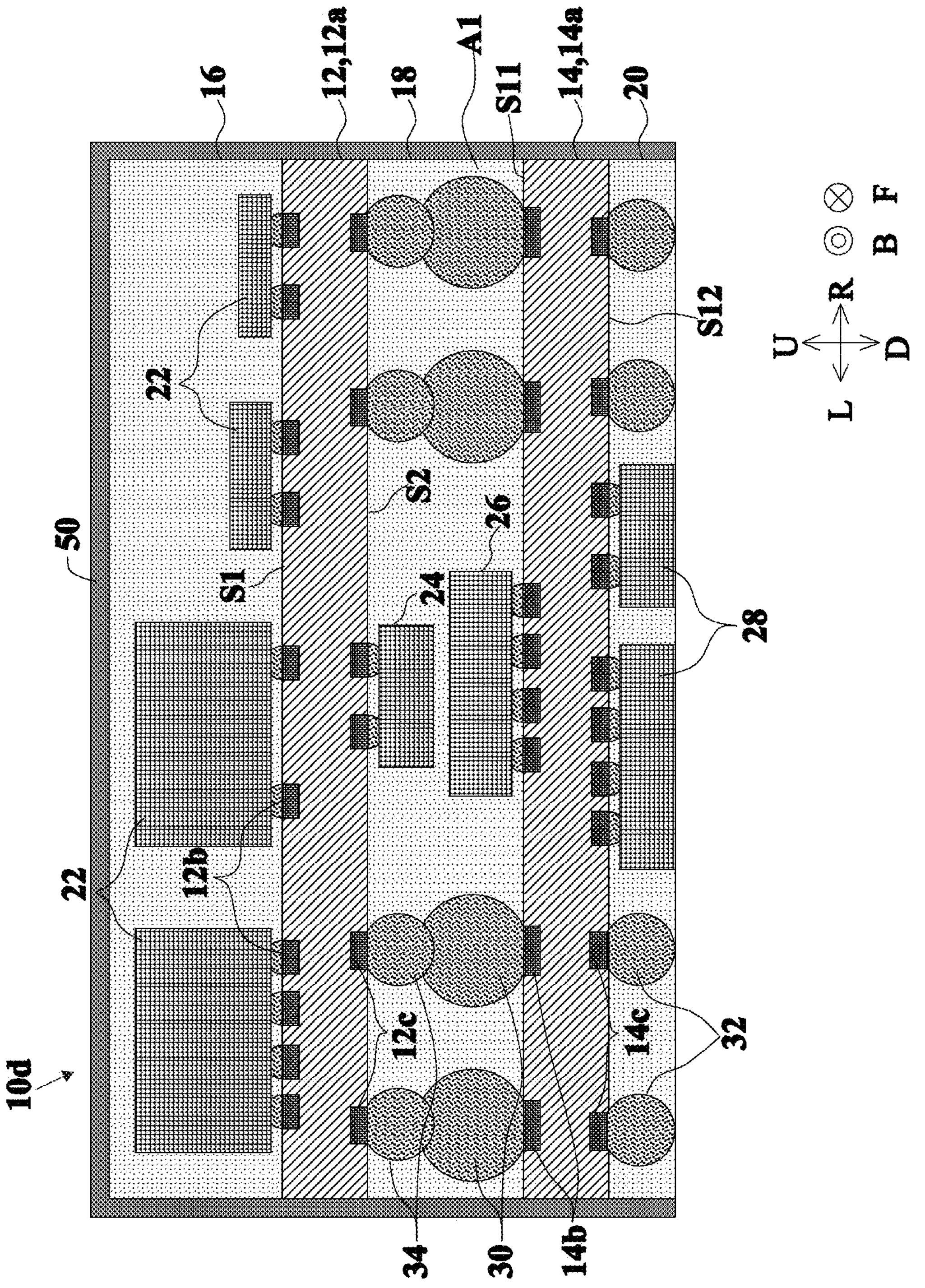
FIG. 5 is a cross-sectional view of a circuit module **10*d***.

Hereinafter, a circuit module 10*d* according to a fourth modification will be described with reference to the drawings. FIG. 5 is a cross-sectional view of the circuit module 10*d*.

The circuit module 10*d* is different from the circuit module 10*b* in further including a shield conductor 50. The shield conductor 50 covers an upper surface of the second sealing resin 16 and side surfaces of the second sealing resin 16 located in a direction orthogonal to the up-down direction, side surfaces of the upper circuit board 12 located in the direction orthogonal to the up-down direction, side surfaces of the first sealing resin 18 located in the direction orthogonal to the up-down direction, and side surfaces of the lower circuit board 14 located in the direction orthogonal to the up-down direction. The side surfaces located in the direction orthogonal to the up-down direction are a front surface, a back surface, a left surface, and a right surface. The shield conductor 50 is connected to the ground potential. Other structures of the circuit module 10*d* are the same as those of the circuit module 10*b*, and thus description thereof will be omitted. The circuit module 10*d* has the same function and effect as the circuit module 10*b*.

In addition, the circuit module 10*d* includes the shield conductor 50 connected to the ground potential. Therefore, the emission of noise from the circuit module 10*d* to the outside of the circuit module 10*d* is suppressed, and the intrusion of noise into the circuit module 10*d* from the outside of the circuit module 10*d* is suppressed.

Fifth Modification

Figure 6:
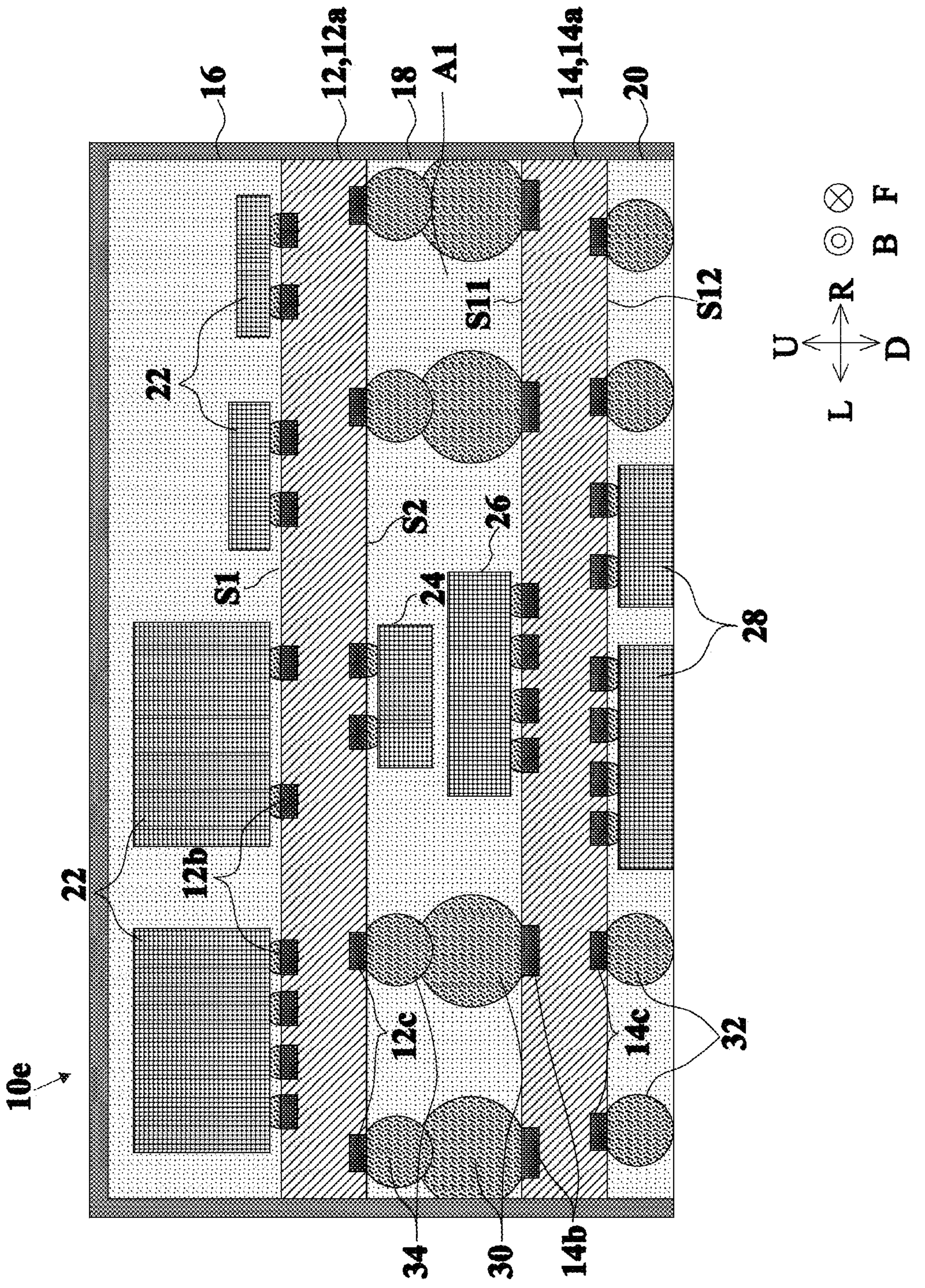
FIG. 6 is a cross-sectional view of a circuit module **10*e***.

Hereinafter, a circuit module 10*e* according to a fifth modification will be described with reference to the drawings. FIG. 6 is a cross-sectional view of the circuit module 10*e*.

The circuit module 10*e* is different from the circuit module 10*d* in that at least one of the plurality of second solder balls 30 is in contact with the shield conductor 50. In the present embodiment, two second solder balls 30 are in contact with shield conductor 50. Other structures of the circuit module 10*e* are the same as those of the circuit module 10*d*, and thus description will be omitted. The circuit module 10*e* has the same functions and effects as those of the circuit module 10*d*. In addition, according to the circuit module 10*e*, the shield conductor 50 is connected to the ground potential via the second solder balls 30.

In general, the shield conductor is connected to an electrode exposed on a surface or a side surface of the circuit board. However, in a case where it is difficult to secure an area for connecting the electrode and the shield, a connection failure or resistance of the connection portion increases. In this case, there is a concern that the shielding performance of the shield conductor is deteriorated. However, by using the second solder balls 30, it is easy to increase a contact area between the second solder balls 30 and shield conductor 50. As a result, in the circuit module 10*e*, the second solder balls 30 and the shield conductor 50 are more reliably connected, and the resistance of the connection portion between the second solder balls 30 and the shield conductor 50 is reduced. As described above, the shielding performance of the shield conductor 50 can be improved.

Other Embodiments

The circuit module according to the present disclosure is not limited to the circuit modules 10 and 10*a* to 10*e*, and can be changed within the scope of the gist thereof. The structures of the circuit modules 10 and 10*a* to 10*e* may be arbitrarily combined.

The circuit modules 10 and 10*a* to 10*e* each include the plurality of first solder balls 32. However, the circuit modules 10 and 10*a* to 10*e* each only need to include one or more first solder balls 32.

The circuit modules 10 and 10*a* to 10*e* each include the plurality of second solder balls 30. However, the circuit modules 10 and 10*a* to 10*e* each only need to include one or more second solder balls 30.

The circuit module 10*c* includes the plurality of via hole conductors v. However, the circuit module 10*c* only needs to include one or more via hole conductors v.

In the circuit module 10*e*, at least one of one or more second solder balls 30 only needs to be in contact with the shield conductor 50.

The circuit modules 10 and 10*a* to 10*e* each include the plurality of first electronic components 24. However, the circuit modules 10 and 10*a* to 10*e* each only need to include one or more first electronic components 24.

The circuit modules 10 and 10*a* to 10*e* include the plurality of second electronic components 26. However, the circuit modules 10 and 10*a* to 10*e* each only need to include one or more second electronic components 26.

The circuit modules 10*b*, 10*d*, and 10*e* each include the plurality of third solder balls 34. However, the circuit modules 10*b*, 10*d*, and 10*e* each only need to include one or more third solder balls 34.

The second sealing resin 16 and the third sealing resin 20 are not essential components.

The third electronic component 22, the first electronic component 24, the second electronic component 26, and the fourth electronic component 28 are not essential components.

The second solder ball 30, the first solder ball 32, and the third solder ball 34 may have an ellipsoidal shape other than a spherical shape. The ellipsoidal shape that is not spherical has a major axis and a minor axis having different lengths. In this case, the size of the solder ball is the maximum width of the solder ball in the direction orthogonal to the up-down direction.

10, 10*a* to 10*e* circuit module
12 upper circuit board
12*a*, 14*a* board body
12*b*, 12*c*, 14*b*, 14*c* mounting electrode
14 lower circuit board
16 second sealing resin
18 first sealing resin
20 third sealing resin
22 third electronic component
24 first electronic component
26 second electronic component
28 fourth electronic component
30 second solder ball
32 first solder ball
34 third solder ball
50 shield conductor
A1 inter-board region
S1 first upper main surface
S11 second upper main surface
S12 second lower main surface
S2 first lower main surface
S31 lower main surface
Sd bottom surface
v via hole conductor

The invention claimed is:

1. A circuit module comprising:

an upper circuit board having a first upper main surface and a first lower main surface arranged in an up-down direction;

a lower circuit board having a second upper main surface and a second lower main surface arranged in the up-down direction, the lower circuit board being located below the upper circuit board and overlapping the upper circuit board when viewed in the up-down direction;

one or more first solder balls each having an ellipsoidal shape and provided on the second lower main surface;

one or more second solder balls each having an ellipsoidal shape, located in an inter-board region between the upper circuit board and the lower circuit board, and electrically connecting the upper circuit board and the lower circuit board, the second solder balls having a maximum width in a direction orthogonal to the up-down direction larger than a maximum width of the first solder balls in the direction orthogonal to the up-down direction; and a first sealing resin provided in the inter-board region so as to be in contact with the first lower main surface and the second upper main surface and cover surfaces of the one or more second solder balls, wherein the circuit module further includes a second sealing resin covering the first upper main surface, and wherein the circuit module further includes a shield conductor covering an upper surface of the second sealing resin, a side surface of the second sealing resin located in the direction orthogonal to the up-down direction, a side surface of the upper circuit board located in the direction orthogonal to the up-down direction, a side surface of the first sealing resin located in the direction orthogonal to the up-down direction, and a side surface of the lower circuit board located in the direction orthogonal to the up-down direction.

2. The circuit module according to claim 1, wherein at least one of the one or more second solder balls is in contact with the shield conductor.

3. The circuit module according to claim 2, wherein the circuit module further includes a third sealing resin covering the second lower main surface.

4. The circuit module according to claim 2, wherein the circuit module includes:

one or more first electronic components mounted on the first lower main surface; and one or more second electronic components mounted on the second upper main surface, wherein the one or more second electronic components do not overlap the one or more first electronic components when viewed in the up-down direction, and wherein the one or more second solder balls are in contact with a mounting electrode of the upper circuit board and a mounting electrode of the lower circuit board.

5. The circuit module according to claim 2, wherein the circuit module includes:

one or more second electronic components mounted on the second upper main surface; and one or more via hole conductors having a frustum shape having a central axis extending in the up-down direction, located in the inter-board region between the upper circuit board and the lower circuit board, and electrically connecting the upper circuit board and the lower circuit board, wherein the one or more second solder balls are in contact with a mounting electrode of the lower circuit board, wherein the one or more via hole conductors are in contact with a mounting electrode of the upper circuit board, and wherein the one or more second solder balls and the one or more via hole conductors are arranged in the up-down direction and are in contact with each other.

6. The circuit module according to claim 1, wherein the circuit module further includes a third sealing resin covering the second lower main surface.

7. The circuit module according to claim 6, wherein the one or more first solder balls each have a bottom surface being a plane orthogonal to the up-down direction, and wherein the bottom surface of each of the one or more first solder balls is included in one plane together with a lower main surface of the third sealing resin.

8. The circuit module according to claim 7, wherein the circuit module includes:

one or more first electronic components mounted on the first lower main surface; and one or more second electronic components mounted on the second upper main surface, wherein the one or more second electronic components do not overlap the one or more first electronic components when viewed in the up-down direction, and wherein the one or more second solder balls are in contact with a mounting electrode of the upper circuit board and a mounting electrode of the lower circuit board.

9. The circuit module according to claim 6, wherein the circuit module includes:

one or more first electronic components mounted on the first lower main surface; and one or more second electronic components mounted on the second upper main surface, wherein the one or more second electronic components do not overlap the one or more first electronic components when viewed in the up-down direction, and wherein the one or more second solder balls are in contact with a mounting electrode of the upper circuit board and a mounting electrode of the lower circuit board.

10. The circuit module according to claim 1, wherein the circuit module includes:

one or more first electronic components mounted on the first lower main surface; and one or more second electronic components mounted on the second upper main surface, wherein the one or more second electronic components do not overlap the one or more first electronic components when viewed in the up-down direction, and wherein the one or more second solder balls are in contact with a mounting electrode of the upper circuit board and a mounting electrode of the lower circuit board.

11. The circuit module according to claim 1, wherein the circuit module includes:

one or more second electronic components mounted on the second upper main surface; and one or more via hole conductors having a frustum shape having a central axis extending in the up-down direction, located in the inter-board region between the upper circuit board and the lower circuit board, and electrically connecting the upper circuit board and the lower circuit board, wherein the one or more second solder balls are in contact with a mounting electrode of the lower circuit board, wherein the one or more via hole conductors are in contact with a mounting electrode of the upper circuit board, and wherein the one or more second solder balls and the one or more via hole conductors are arranged in the up-down direction and are in contact with each other.

12. The circuit module according to claim 1, wherein the circuit module includes:

one or more first electronic components mounted on the first lower main surface;

one or more second electronic components mounted on the second upper main surface; and one or more third solder balls each having an ellipsoidal shape, located in the inter-board region between the upper circuit board and the lower circuit board, and electrically connecting the upper circuit board and the lower circuit board, wherein at least one of the one or more first electronic components overlaps at least one of the one or more second electronic components when viewed in the up-down direction, wherein the one or more second solder balls are in contact with a mounting electrode of the lower circuit board, wherein the one or more third solder balls are in contact with a mounting electrode of the upper circuit board, and wherein the one or more second solder balls and the one or more third solder balls are arranged in the up-down direction and are in contact with each other.

13. A circuit module comprising:

an upper circuit board having a first upper main surface and a first lower main surface arranged in an up-down direction;

a lower circuit board having a second upper main surface and a second lower main surface arranged in the up-down direction, the lower circuit board being located below the upper circuit board and overlapping the upper circuit board when viewed in the up-down direction;

one or more first solder balls each having an ellipsoidal shape and provided on the second lower main surface;

one or more second solder balls each having an ellipsoidal shape, located in an inter-board region between the upper circuit board and the lower circuit board, and electrically connecting the upper circuit board and the lower circuit board, the second solder balls having a maximum width in a direction orthogonal to the up-down direction larger than a maximum width of the first solder balls in the direction orthogonal to the up-down direction; and a first sealing resin provided in the inter-board region so as to be in contact with the first lower main surface and the second upper main surface and cover surfaces of the one or more second solder balls, wherein the circuit module includes:

one or more second electronic components mounted on the second upper main surface; and one or more via hole conductors having a frustum shape having a central axis extending in the up-down direction, located in the inter-board region between the upper circuit board and the lower circuit board, and electrically connecting the upper circuit board and the lower circuit board, wherein the one or more second solder balls are in contact with a mounting electrode of the lower circuit board, wherein the one or more via hole conductors are in contact with a mounting electrode of the upper circuit board, and wherein the one or more second solder balls and the one or more via hole conductors are arranged in the up-down direction and are in contact with each other.

14. The circuit module according to claim 13, wherein the circuit module further includes a second sealing resin covering the first upper main surface.

15. The circuit module according to claim 13, wherein the circuit module further includes a third sealing resin covering the second lower main surface.

16. The circuit module according to claim 15, wherein the one or more first solder balls each have a bottom surface being a plane orthogonal to the up-down direction, and wherein the bottom surface of each of the one or more first solder balls is included in one plane together with a lower main surface of the third sealing resin.

17. A circuit module comprising:

an upper circuit board having a first upper main surface and a first lower main surface arranged in an up-down direction;

a lower circuit board having a second upper main surface and a second lower main surface arranged in the up-down direction, the lower circuit board being located below the upper circuit board and overlapping the upper circuit board when viewed in the up-down direction;

one or more first solder balls each having an ellipsoidal shape and provided on the second lower main surface;

one or more second solder balls each having an ellipsoidal shape, located in an inter-board region between the upper circuit board and the lower circuit board, and electrically connecting the upper circuit board and the lower circuit board, the second solder balls having a maximum width in a direction orthogonal to the up-down direction larger than a maximum width of the first solder balls in the direction orthogonal to the up-down direction; and a first sealing resin provided in the inter-board region so as to be in contact with the first lower main surface and the second upper main surface and cover surfaces of the one or more second solder balls, wherein the circuit module includes:

one or more first electronic components mounted on the first lower main surface;

one or more second electronic components mounted on the second upper main surface; and one or more third solder balls each having an ellipsoidal shape, located in the inter-board region between the upper circuit board and the lower circuit board, and electrically connecting the upper circuit board and the lower circuit board, wherein at least one of the one or more first electronic components overlaps at least one of the one or more second electronic components when viewed in the up-down direction, wherein the one or more second solder balls are in contact with a mounting electrode of the lower circuit board, wherein the one or more third solder balls are in contact with a mounting electrode of the upper circuit board, and wherein the one or more second solder balls and the one or more third solder balls are arranged in the up-down direction and are in contact with each other.

18. The circuit module according to claim 17, wherein the circuit module further includes a second sealing resin covering the first upper main surface.

19. The circuit module according to claim 17, wherein the circuit module further includes a third sealing resin covering the second lower main surface.

20. The circuit module according to claim 19, wherein the one or more first solder balls each have a bottom surface being a plane orthogonal to the up-down direction, and wherein the bottom surface of each of the one or more first solder balls is included in one plane together with a lower main surface of the third sealing resin.

* * * * *